(12) United States Patent
Kim et al.

(10) Patent No.: US 8,558,274 B2
(45) Date of Patent: Oct. 15, 2013

(54) LIGHT-EMITTING DIODE AND METHOD OF MANUFACTURING THE SAME

(75) Inventors: Junyoun Kim, Hwaseong-si (KR); Taek Kim, Seongnam-si (KR); Kyoungkook Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 702 days.

(21) Appl. No.: 12/385,744

(22) Filed: Apr. 17, 2009

(65) Prior Publication Data

US 2010/0096614 A1 Apr. 22, 2010

(30) Foreign Application Priority Data

Oct. 21, 2008 (KR) ........................ 10-2008-0103205

(51) Int. Cl.
*H01L 33/00* (2010.01)
(52) U.S. Cl.
USPC .................................. 257/103; 257/E33.006
(58) Field of Classification Search
USPC ........................ 257/79, 86, 87, 103
See application file for complete search history.

(56) References Cited

U.S. PATENT DOCUMENTS

| | | | | |
|---|---|---|---|---|
| 6,806,115 B2 * | 10/2004 | Koide et al. | | 438/44 |
| 7,400,665 B2 * | 7/2008 | Wang et al. | | 372/50.124 |
| 7,435,996 B2 * | 10/2008 | Jin et al. | | 257/88 |
| 7,816,700 B2 * | 10/2010 | Kim | | 257/98 |
| 2001/0050376 A1 * | 12/2001 | Shibata et al. | | 257/190 |
| 2003/0155575 A1 * | 8/2003 | Shibata et al. | | 257/79 |
| 2003/0168964 A1 * | 9/2003 | Chen | | 313/495 |
| 2005/0194598 A1 * | 9/2005 | Kim et al. | | 257/79 |
| 2005/0224790 A1 * | 10/2005 | Jin et al. | | 257/43 |
| 2008/0036038 A1 * | 2/2008 | Hersee et al. | | 257/615 |
| 2008/0149944 A1 * | 6/2008 | Samuelson et al. | | 257/88 |
| 2010/0127238 A1 * | 5/2010 | Kim et al. | | 257/13 |
| 2011/0012168 A1 * | 1/2011 | Armitage | | 257/103 |

FOREIGN PATENT DOCUMENTS

| | | |
|---|---|---|
| KR | 10-2006-0121413 A | 11/2006 |
| KR | 10-2006-0121432 A | 11/2006 |
| KR | 10-2007-0096359 A | 10/2007 |
| KR | 2007-319988 A | 12/2007 |
| KR | 2008-66590 A | 3/2008 |

OTHER PUBLICATIONS

Wang et al., "Highly polarized photoluminescence and photodetection from single indium phosphide nanowires," *Science*, vol. 293, pp. 1455-1457 (Aug. 24, 2001).

Han et al., "Photoconduction studies on GaN nanowire transistors under UV and polarized UV illumination," *Chemical Physics Letters*, vol. 389, pp. 176-180 (2004).

(Continued)

*Primary Examiner* — Benjamin Sandvik
(74) *Attorney, Agent, or Firm* — Harness, Dickey & Pierce, P.L.C.

(57) ABSTRACT

A light-emitting diode and a method of manufacturing the light-emitting diode are provide, the light-emitting diode including a lower electrode on a substrate, a template layer on the lower electrode. The template layer may have a plurality of open regions. A plurality of nano-dashes may be formed in the plurality of open regions of the template layer. A transparent insulating layer may be formed between the nano-dashes. A transparent upper electrode may be formed on the nano-dashes and the transparent insulating layer.

16 Claims, 10 Drawing Sheets

(56) References Cited

OTHER PUBLICATIONS

Ahn et al., "Efficient visible light detection using individual germanium nanowire field effect transistors," *Applied Physics Letters*, vol. 91, pp. 162102 (2007).

Fan et al., "Photoluminescence and polarized photodetection of single ZnO nanowires," *Applied Physics Letters*, vol. 85, No. 25, pp. 6128-6130 (Dec. 20, 2004).

Qian et al., "Core/Multishell nanowire heterostructures as multicolor, high-efficiency light-emitting diodes," *Nano Letters*, vol. 5, No. 11, pp. 2287-2291 (2005).

* cited by examiner

LIGHT-EMITTING DIODE AND METHOD OF MANUFACTURING THE SAME

CROSS-REFERENCE TO RELATED APPLICATIONS

This application claims the benefit of priority under 35 U.S.C. §119 from Korean Patent Application No. 10-2008-0103205, filed on Oct. 21, 2008, in the Korean Intellectual Property Office, the disclosure of which is incorporated herein in their entirety by reference.

BACKGROUND

1. Field

Example embodiments relate to a light-emitting diode and a method of manufacturing the same.

2. Description of the Related Art

Light-emitting diodes (LED) that use semiconductors are highly-efficient and environmentally-friendly light sources. LEDs are widely used in various fields (e.g., displays, optical communication, automobiles, lighting, etc). One widely-used semiconductor is a gallium nitride (GaN)-based compound semiconductor. Research has been conducted on the use of gallium nitride (GaN)-based compound semiconductors as a material for forming LEDs.

GaN-based compound semiconductors have a wide band gap and may be used to obtain light in nearly all wavelength bands ranging from visible light to ultraviolet (UV) radiation according to the nitride composition. If GaN-based compound semiconductors are grown in the shape of a thin film, the light-emitting efficiency may be degraded due to lattice mismatch between a substrate and the thin film formed of the GaN-based compound semiconductor.

Technology for manufacturing a light-emitting diode by growing a semiconductor in line-shaped fine rods (e.g., in the shape of nanorods or nanowires) has been researched. If a semiconductor formed of GaN is grown in the shape of nanorods, the effects caused by lattice mismatch are relatively insignificant. As such, a crystalline structure having no defects may be obtained.

The light-emitting efficiency of a light-emitting diode manufactured in the shape of nanorods or nanowires may be higher than light-emitting efficiency of a light-emitting diode manufactured in the shape of a thin film. However, it is not easy to accurately control the location and/or size of the nanorods. Light emitted from a light-emitting diode in the shape of nanorods may be reabsorbed into the nanorods. Leakage current may be generated along the surface of the nanorods. Due to a substantially small contact area between the nanorods and electrodes, serial resistance may be increased, degrading the efficiency of the light-emitting diode. A light-emitting diode manufactured in the shape of nanorods cannot provide polarized light.

SUMMARY

Example embodiments relate to a light-emitting diode and a method of manufacturing the same.

Example embodiments include a light-emitting diode that is not significantly (or adversely) affected by lattice mismatch between a substrate and a semiconductor material and a method of manufacturing the same. Example embodiments include a light-emitting diode that enhances light extraction efficiency and a method of manufacturing the light-emitting diode.

Example embodiments provide a light-emitting diode including a lower electrode disposed on a substrate. A template layer may be disposed on the lower electrode and having a plurality of open regions. A plurality of nano-dashes may be grown in the plurality of open regions of the template layer. A transparent insulating layer may be filled between the nano-dashes. A transparent upper electrode may be disposed on the nano-dashes and the transparent insulating layer.

The lower electrode may be a reflective electrode that reflects light emitted from the nano-dashes toward the upper electrode.

The lower electrode may include at least one material selected from the group consisting of zirconium nitride (ZrN), hafnium nitride (HfN), titanium nitride (TiN), zirconium boride (ZrB$_2$) and combinations thereof.

The light-emitting diode may include a buffer layer disposed between the substrate and the lower electrode, and a semiconductor layer disposed between the lower electrode and the template layer.

The template layer may include at least one dielectric material selected from the group consisting of silicon oxide (SiO$_2$), silicon nitride (SiN$_x$), aluminium oxide (Al$_2$O$_3$), aluminium nitride (AlN), hafnium oxide (HfO) and combinations thereof. The template layer may have a thickness in the range of about 100-nm to about 2-μm.

Each of the open regions of the template layer may have a width (W) in the range of about 50-nm to about 500-nm, and a length (L) in the range of about 50-nm to about 5-μm. An interval between adjacent open regions of the open regions may be in the range of about 5-nm to about 500-nm.

In the open regions of the template layer, L/W may be 5 or more and W=λ/2n, wherein λ represents a light-emitting wavelength and n represents a refractive index of the nano-dashes.

The light-emitting diode may include a passivation layer formed on side surfaces of the nano-dashes.

The nano-dashes may include a first region doped with a first conductivity-type dopant, a second region doped with a second conductivity-type dopant opposite in conductivity to the first conductivity-type dopant, and an active region between the first region and the second region. The nano-dashes may include at least one material selected from the group consisting of (In)GaN, Zn(Mg)O, Zn(Cd)O, (Al)(In)GaAs, (Al)(In)GaAsP, (Al)(In)(Ga)NAs, InP, InAs and combinations thereof.

The nano-dashes may be grown on the open regions of the template layer using a metallic catalyst or nucleation site. The metallic catalyst may include at least one material selected from the group consisting of gold (Au), nickel (Ni), iron (Fe), nickel (Ni) nitrate and combinations thereof. The metallic catalyst may provide an ohmic contact between the nano-dashes and the upper electrode after the nano-dashes are grown.

The light-emitting diode may include a distributed Bragg reflector (DBR), which is a structure formed from multiple layers of alternating two materials having different refractive indices from each other. The DBR may be disposed under the nano-dashes or on the entire top surface of the lower electrode.

Example embodiments provide a method of manufacturing a light-emitting diode including forming a lower electrode on a substrate. A template layer, which is formed of a dielectric material, may be formed on the lower electrode. The template layer may be patterned and etched until the lower electrode is exposed, forming a plurality of open regions in the template layer. A plurality of nano-dashes may be grown in the plurality of open regions of the template layer. A transparent insulating layer may be filled (or formed) between the nano-dashes. A transparent upper electrode may be formed on the nano-dashes and the transparent insulating layer.

The method may include forming a buffer layer between the substrate and the lower electrode, and forming a semiconductor layer between the lower electrode and the template layer.

The method may include forming a passivation layer on side surfaces of the nano-dashes, after growing the nano-dashes.

The method may include forming a distributed Bragg reflector (DBR), which is a structure formed from multiple layers of alternating two materials having different refractive indices. The DBR may be formed on the open regions of the template layer, prior to growing the nano-dashes.

The growing of the nano-dashes may include forming a catalyst metallic layer on the entire surface of the template layer. The catalyst metallic layer may be heated such that a plurality of metallic catalysts is formed in the open regions of the template layer. The metallic catalysts may adhere and connect to one another. The nano-dashes may be grown by performing a vapor-liquid-solid (VLS) growth method using the metallic catalysts.

The growing of the nano-dashes may include disposing a plurality of nucleation sites in the open regions of the template layer wherein the nucleation sites adhere and connect to one another. The nano-dashes may be grown by performing a hydride vapor phase epitaxy (HVPE) process, a molecular beam epitaxy (MBE) process, a metal organic vapor phase epitaxy (MOVPE) process or similar process using the nucleation sites. The nucleation sites in the open regions may adhere and connect to one another.

After forming the plurality of open regions in the template layer, a width of each of the open regions may be reduced by forming a dielectric layer on inner walls of the open regions using a sidewall pattern transfer method.

The substrate may include at least one material selected from the group consisting of Si(111), GaN, sapphire, SiC, $LiGaO_2$, $ZrB_2$, ZnO, (Mn,Zn)$FeO_4$(111) and combinations. Additional aspects will be set forth in part in the description which follows and, in part, will be apparent from the description, or may be learned by practice of the invention.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
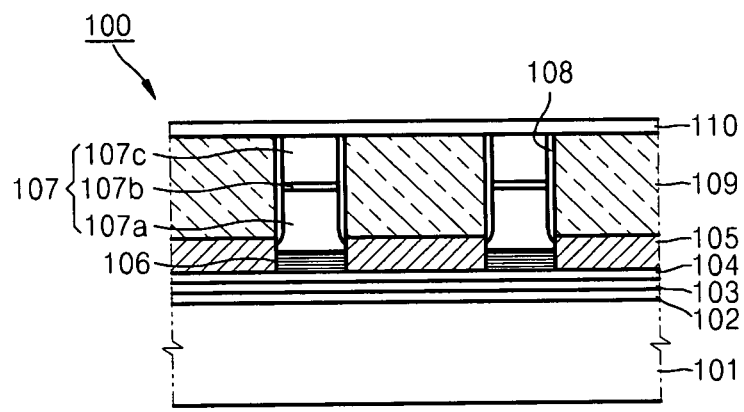
FIG. 1 is a schematic cross-sectional view illustrating a structure of a light-emitting diode according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

FIG. 1 is a schematic cross-sectional view illustrating a structure of a light-emitting diode according to example embodiments.

Referring to FIG. 1, the light-emitting diode 100 according to example embodiments includes a substrate 101, a buffer layer 102, a lower electrode 103, and a semiconductor layer 104, sequentially disposed on the substrate 101. A template layer 105 may be disposed on the semiconductor layer 104. A plurality of nano-dashes 107 may be formed in a plurality of open regions (see open regions 120 shown in FIG. 4) of the template layer 105. A transparent insulating layer 109 may be filled between the nano-dashes 107. An upper electrode 110 disposed on the nano-dashes 107 and the transparent insulating layer 109. A passivation layer 108 may be formed on a side surface of each of the nano-dashes 107. A reflective layer 106 may be formed under the nano-dashes 107.

In FIG. 1, the reflective layer 106 is formed under the nano-dashes 107. However, example embodiments are not limited thereto. The reflective layer 106 may be formed, for example, on the entire top surface of the semiconductor layer 104. Or, the reflective layer 106 may be formed on the entire top surface of the lower electrode 103 (for example, if the semiconductor layer 104 is not used), and the nano-dashes 107 may be disposed on the reflective layer 106.

A semiconductor material such as silicon (Si) (e.g., Si(111)) may be used to form the substrate 101. Besides silicon (Si), other materials (e.g., GaN, sapphire, SiC, LiGaO2, ZrB2, ZnO, (Mn,Zn)FeO4(111), or the like) may also be used to form the substrate 101. According to example embodiments, the nano-dashes 107 are not significantly (or adversely) affected by lattice mismatch. As such, a substrate formed of any material may be selected.

The lower electrode 103 disposed above the substrate 101 is used to apply a current to the nano-dashes 107. A metallic material having high conductivity may be used to form the lower electrode 103. The lower electrode 103 may also function as a reflector that reflects light emitted from the nano-dashes 107 upwards. If the lower electrode 103 functions as a reflector, the reflective layer 106 illustrated in FIG. 1 is not necessary. According to other example embodiments, the reflective layer 106 and the lower electrode 103 may both reflect light emitted from the nano-dashes 107. A single metal having good reflectivity and good conductivity may be used to form the lower electrode 103. A material (e.g., zirconium nitride (ZrN), hafnium nitride (HfN), titanium nitride (TiN), zirconium boride (ZrB2) or the like) may be used to facilitate formation of the semiconductor layer 104 and the nano-dashes 107.

According to example embodiments, the lower electrode 103 may be formed directly on the substrate 101. According to other example embodiments, the lower electrode 103 may be formed on the buffer layer 102, after the buffer layer 102 is formed on the substrate 101. The nano-dashes 107 may be grown directly on the lower electrode 103. According to other example embodiments, the nano-dashes 107 may be grown on the semiconductor layer 104, after the semiconductor layer 104 is formed on the lower electrode 103. By using the semiconductor layer 104 according to example embodiments, the nano-dashes 107 may be easily grown. As such, the quality of the grown nano-dashes 107 may be enhanced in subsequent operations.

The buffer layer 102 and the semiconductor layer 104 may be formed of various materials selected according to the material used to form the nano-dashes 107. For example, if the above-described materials are used to form the lower electrode 103, a material such as low temperature-grown gallium nitride (GaN), aluminum nitride (AlN) or a combination thereof (e.g., ZrN/AlN) may be used to form the buffer layer 102, and the semiconductor layer 104 may be formed of GaN. According to example embodiments, the nano-dashes 107 may be grown directly on the lower electrode 103 without using the buffer layer 102 and the semiconductor layer 104.

The template layer 105 disposed on the semiconductor layer 104 defines the location in which the nano-dashes 107 are to be grown and the size thereof.

Figure 2:
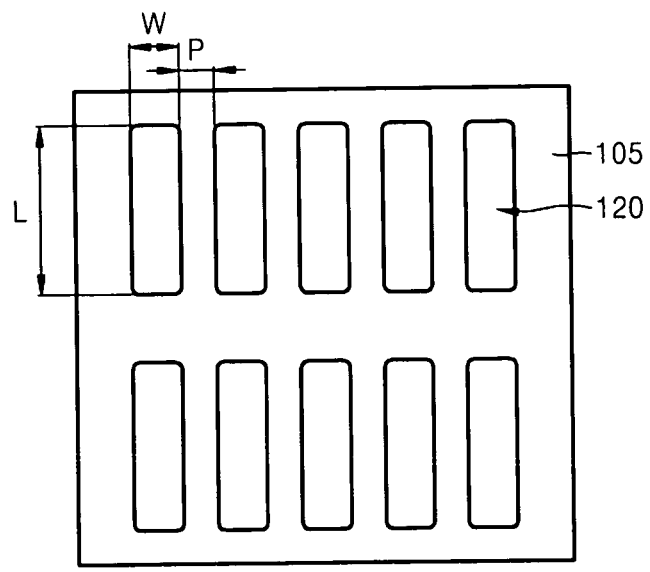
FIG. 2 is a schematic plan view illustrating a shape of a template layer of the light-emitting diode illustrated in FIG. 1 according to example embodiments.
Figure 3:
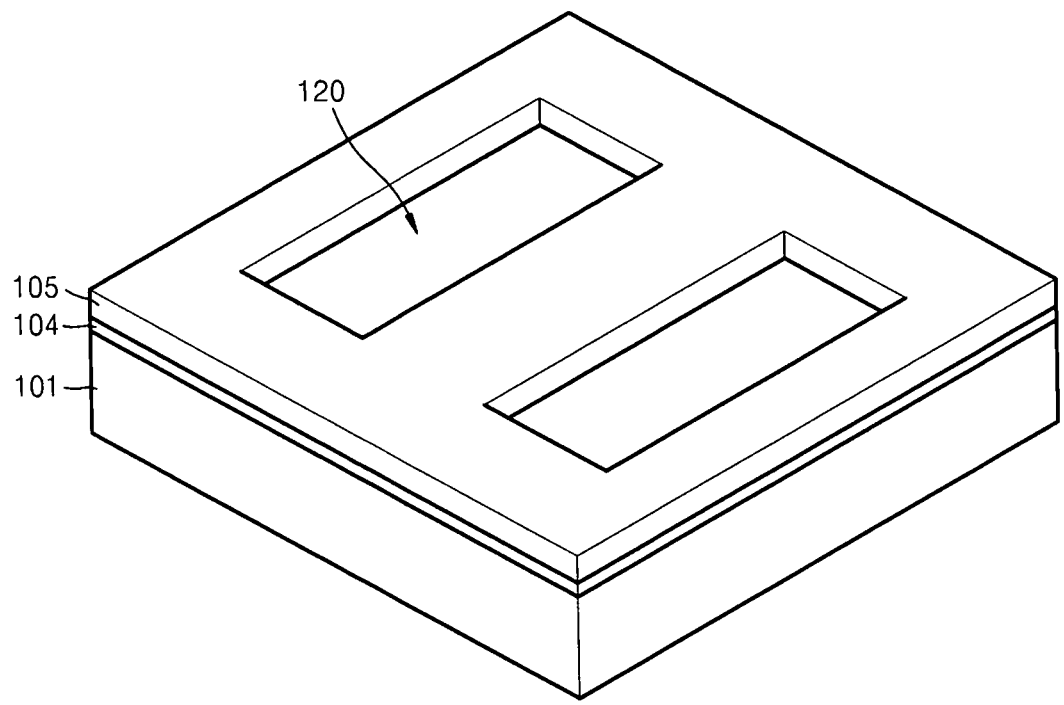
FIG. 3 is a schematic perspective view illustrating the shape of the template layer of the light-emitting diode illustrated in FIG. 1 according to example embodiments.

FIGS. 2 and 3 are schematic plan and perspective views, respectively, illustrating a shape of the template layer according to example embodiments.

Referring to FIGS. 2 and 3, the template layer 105 may have an array of a plurality of open regions 120. The open regions 120 may be fine. After a dielectric material (e.g., silicon oxide (SiO2), silicon nitride (SiNx), aluminum oxide (Al2O3), aluminum nitride (AlN), hafnium oxide (HfO) and combinations thereof) used to form the template layer 105 is formed on the lower electrode 103 or the semiconductor layer 104, the template layer 105 is patterned by performing a lithographic process and etched to expose the semiconductor layer 104 or the lower electrode 103, in order to form the open regions 120. The location and size of the open regions 120 are the same as the location and size of the nano-dashes 107 to be formed later. The thickness of the template layer 105 may be about 100-nm to about 2-μm. A width (W) of each of the open regions 120 may be about 5-nm to about 500 nm. A length (L) of each of the open regions 120 may be about 50-nm to about 5-μm. An interval (P) between the adjacent open regions 120 may be about 50-nm to about 500-nm.

In FIGS. 2 and 3, only several open regions 120 are illustrated. However, example embodiments are not limited thereto. A very large number of open regions 120 may be formed in the template layer 105. In FIG. 3, the buffer layer 102 and the lower electrode 103 are not illustrated between the semiconductor layer 104 and the substrate 101 for the convenience of explanation. The buffer layer 102 and the lower electrode 103 may be interposed between the substrate 101 and the semiconductor layer 104. This applies to FIGS. 5A through 5C, 6A and 6B that will be described later.

Figure 4:
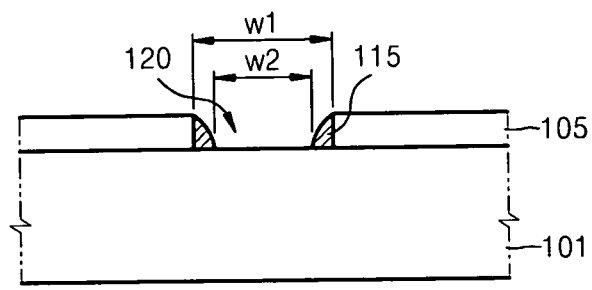
FIG. 4 is a schematic cross-sectional view illustrating a width of each of a plurality of open regions of the template layer of the light-emitting diode illustrated in FIG. 1 according to example embodiments.

FIG. 4 is a schematic cross-sectional view illustrating a width of each of a plurality of open regions of the template layer of the light-emitting diode illustrated in FIG. 1 according to example embodiments The lithographic process for patterning the open regions 120 may be performed by using a KrF excimer laser or an ArF excimer laser. The KrF excimer laser and the ArF excimer laser have wavelengths of about 248-nm and 193-nm, respectively. As such, the open regions 120 having the width W described above may not be easily formed. Thus, as illustrated in FIG. 4, the open regions 120 are formed, and a width of each of the open regions 120 may be subsequently reduced by forming a dielectric layer 115 on inner walls of each of the open regions 120. After a material for forming the dielectric layer 115 is applied on the template layer 105 having the open regions 120, an etching process may be performed until the portion of the semiconductor layer 104 corresponding to the open regions 120 is exposed. The material for forming the dielectric layer 115 remains on inner walls of the open regions 120, forming the dielectric layer 115. By using such sidewall pattern transfer method, the width of each of the open regions 120 may be reduced from w1 to w2, as illustrated in FIG. 4.

The nano-dashes 107 that are grown on the portions of the semiconductor layer 104 in the open regions 120 of the template layer 105 may be shaped as if a plurality of nanorods or nanowires are adhered and connected to one another in a straight line. The nano-dashes 107 are formed of the same material as a material used to form nanorods or nanowires, except that the nano-dashes 107 have a rectangular shape whereby the length thereof is greater than the width. Characteristics of the nano-dashes 107 may be the same as those of nanorods or nanowires The nano-dashes 107 have a light-emitting structure in the form of a p-n junction so as to emit light. As illustrated in FIG. 1, the nano-dashes 107 may include a first region 107a doped with a first conductivity-type dopant, a second region 107c doped with a second conductivity-type dopant opposite in conductivity to the first conductivity-type dopant, and an active region 107b between the first region 107a and the second region 107c. For example, the first region 107a may be doped with an n-type dopant, and the second region 107c may be doped with a p-type dopant. Conversely, the first region 107a may be doped with a p-type dopant, and the second region 107c may be doped with an n-type dopant.

The nano-dashes 107 may be formed of a material such as (In)GaN, Zn(Mg)O, Zn(Cd)O, (Al)(In)GaAs, (Al)(In)GaAsP, (Al)(In)(Ga)NAs, InP, InAs or combinations thereof.

The first region 107a doped with the n-type dopant may be formed of n-(In)GaN, n-Zn(Mg)O, n-Zn(Cd)O, n-(Al)(In)GaAs, n-(Al)(In)GaAsP, n-(Al)(In)(Ga)NAs, n-InP, n-InAs or combination thereof. The second region 107c doped with the p-type dopant may be formed of p-(In)GaN, p-Zn(Mg)O, p-Zn(Cd)O, p-(Al)(In)GaAs, p-(Al)(In)GaAsP, p-(Al)(In)(Ga)NAs, p-InP, p-InAs and combinations thereof. The active region 107b may have a single or multiple quantum well structure formed by adjusting an interval of a band and by periodically varying composition of each element (or component) in the (In)GaN, Zn(Mg)O, Zn(Cd)O, (Al)(In)GaAs, (Al)(In)GaAsP, (Al)(In)(Ga)NAs, InP or InAs compound.

Side surfaces of the nano-dashes 107, which are grown using the above method, may be passivated. If the side surfaces of the nano-dashes 107 are not passivated, a current supplied to the nano-dashes 107 through the lower electrode 103 and the upper electrode 110 may leak from a surface of the nano-dashes 107, degrading the light-emitting efficiency. The passivation layer 108 formed on side surfaces of the nano-dashes 107 is illustrated in FIG. 1. The passivation layer 108 may be formed of a dielectric material obtained by adjusting composition of (Al)(Ga)N, for example. The passivation layer 108 may be formed on the entire side surfaces of the nano-dashes 107. The passivation layer 108 may be formed on at least the active region 107b of the nano-dashes 107. The passivation layer 108 may be used to protect the nano-dashes 107 from electrical and/or chemical shock.

The transparent insulating layer 109 filled between the nano-dashes 107 to electrically insulate the nano-dashes 107. The transparent insulating layer 109 may be used to protect the nano-dashes 107 from physical shock. The transparent insulating layer 109 may be formed of an oxide (e.g., SiO2) or transparent insulating resin (e.g., silicon resin or epoxy resin).

The upper electrode 110 disposed on the nano-dashes 107 may be formed of a transparent conductive material through which light is transmitted. For example, the upper electrode 110 may be formed of a transparent conductive oxide (TCO) (e.g., indium tin oxide (ITO), aluminum zinc oxide (AZO), indium zinc oxide (IZO) and combinations thereof).

The reflective layer 106 may be disposed between the semiconductor layer 104 and the nano-dashes 107 in order to reflect light emitted from the nano-dashes 107. As previously described, if the lower electrode 103 functions as a reflective electrode, the reflective layer 106 may not be required. If the lower electrode 103 does not function as a reflective electrode, the reflective layer 106 may be disposed under the nano-dashes 107. As such, the reflective layer 106 may be formed of a conductive material so that current may be supplied to the nano-dashes 107 through the lower electrode 103. For example, the reflective layer 106 may be a distributed Bragg reflector (DBR), which is a multi-layer structure of alternating two materials having different refractive indices from each other. In general, a DBR may have reflectivity that is close to nearly 100% with respect to a specific wavelength depending on the number of stacks of semiconductor materials and a thickness of a layer of a single semiconductor material. If a DBR is used as the reflective layer 106, semiconductor materials used to form the reflective layer 106 may be doped with the same type dopant as that of the first region 107a of the nano-dashes 107. For example, if the first region 107a of the nano-dashes 107 is doped with an n-type dopant, the semiconductor materials used to form the reflective layer 106 may be doped with the n-type dopant.

A method of growing the nano-dashes in the open regions of the template layer will now be described. Like a related method of growing nanorods, the nano-dashes may be grown using a metallic catalyst or using a nucleation site.

Figure 5A:
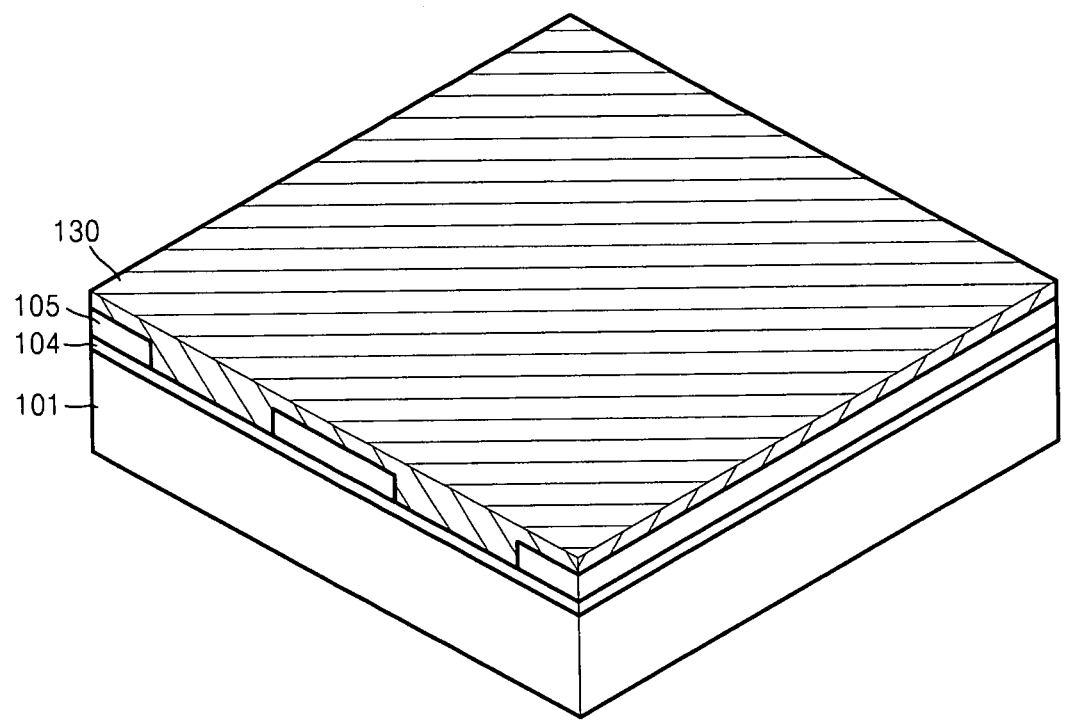
FIGS. 5A through 5C are perspective views schematically illustrating a method of forming nano-dashes in the open regions of the template layer by using a metallic catalyst according to example embodiments.
Figure 5B:
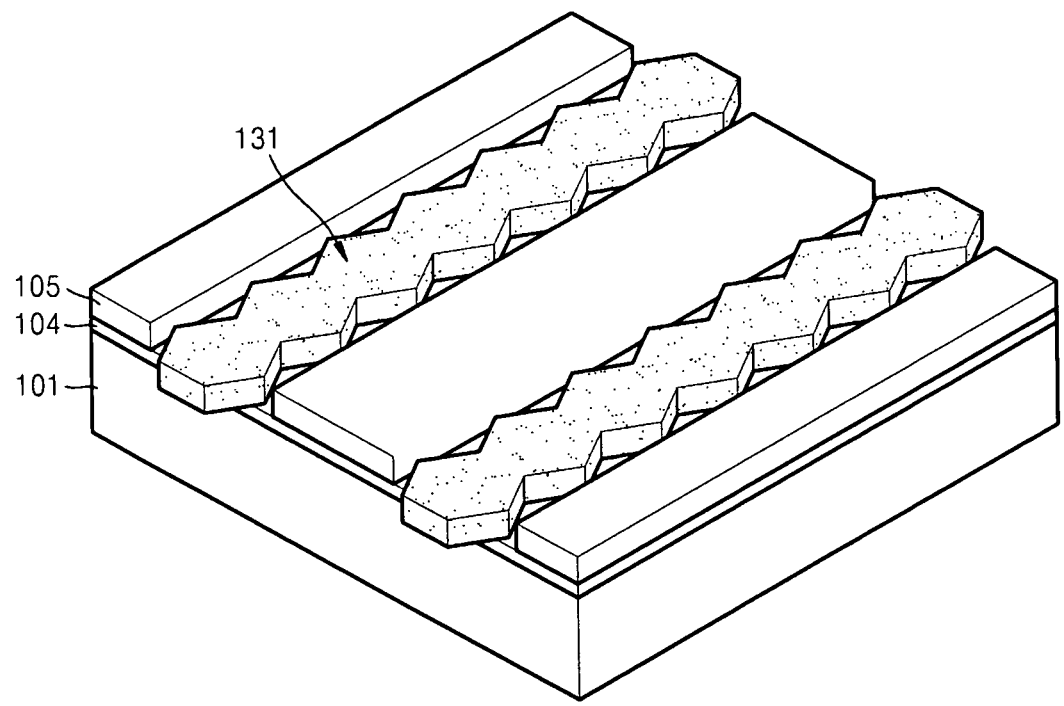
Figure 5C:
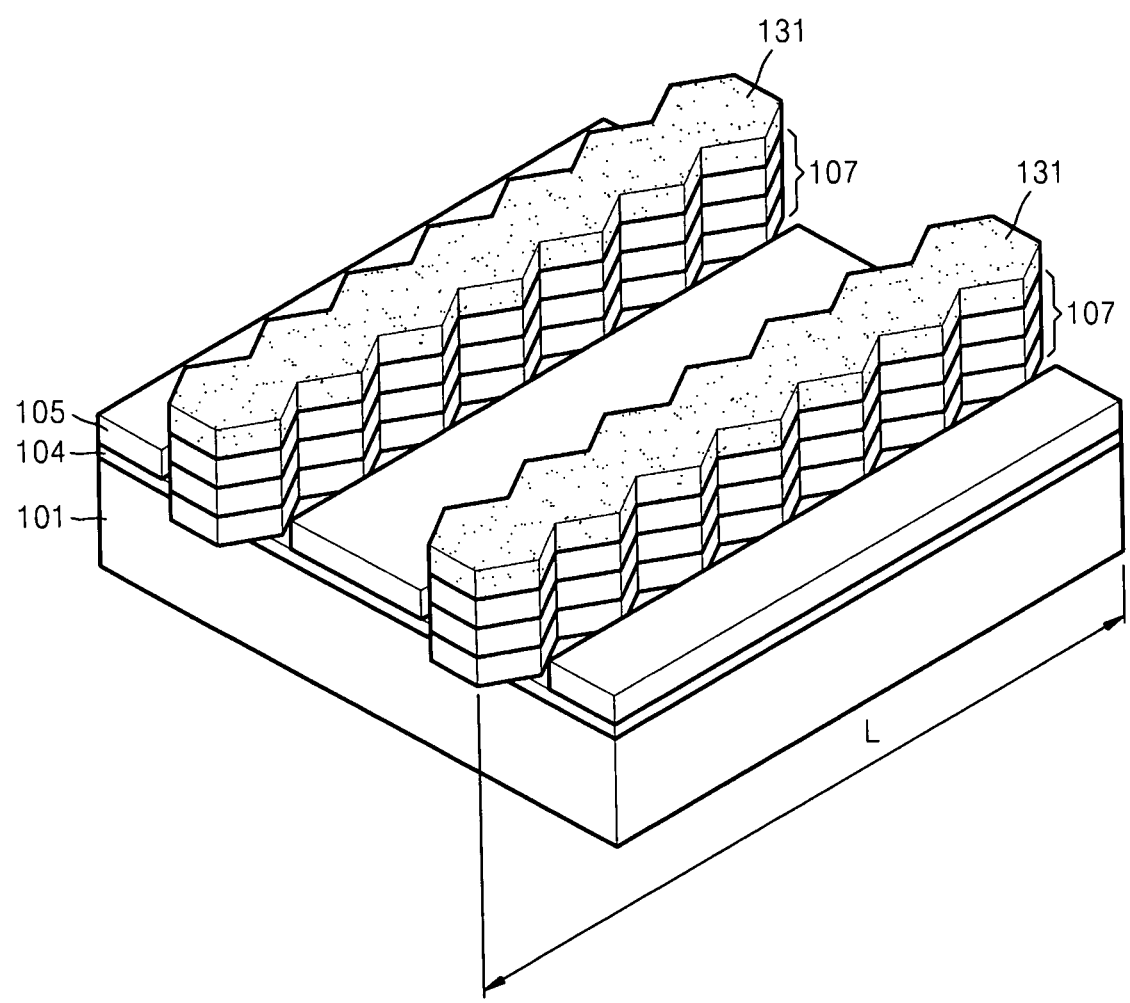

FIGS. 5A through 5C are perspective views schematically illustrating a method of forming the nano-dashes in the open regions of the template layer by using a metallic catalyst according to example embodiments.

Figure 6A:
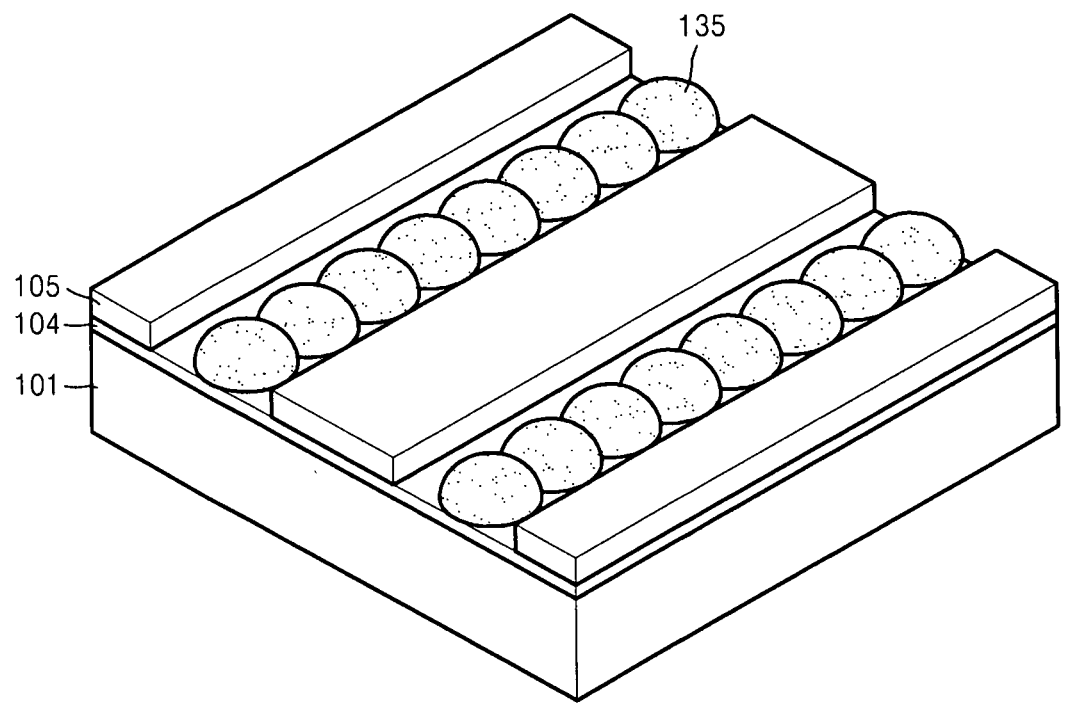
FIGS. 6A and 6B are perspective views schematically illustrating a method of forming the nano-dashes in the open regions of the template layer by using a nucleation site according to example embodiments.
Figure 6B:
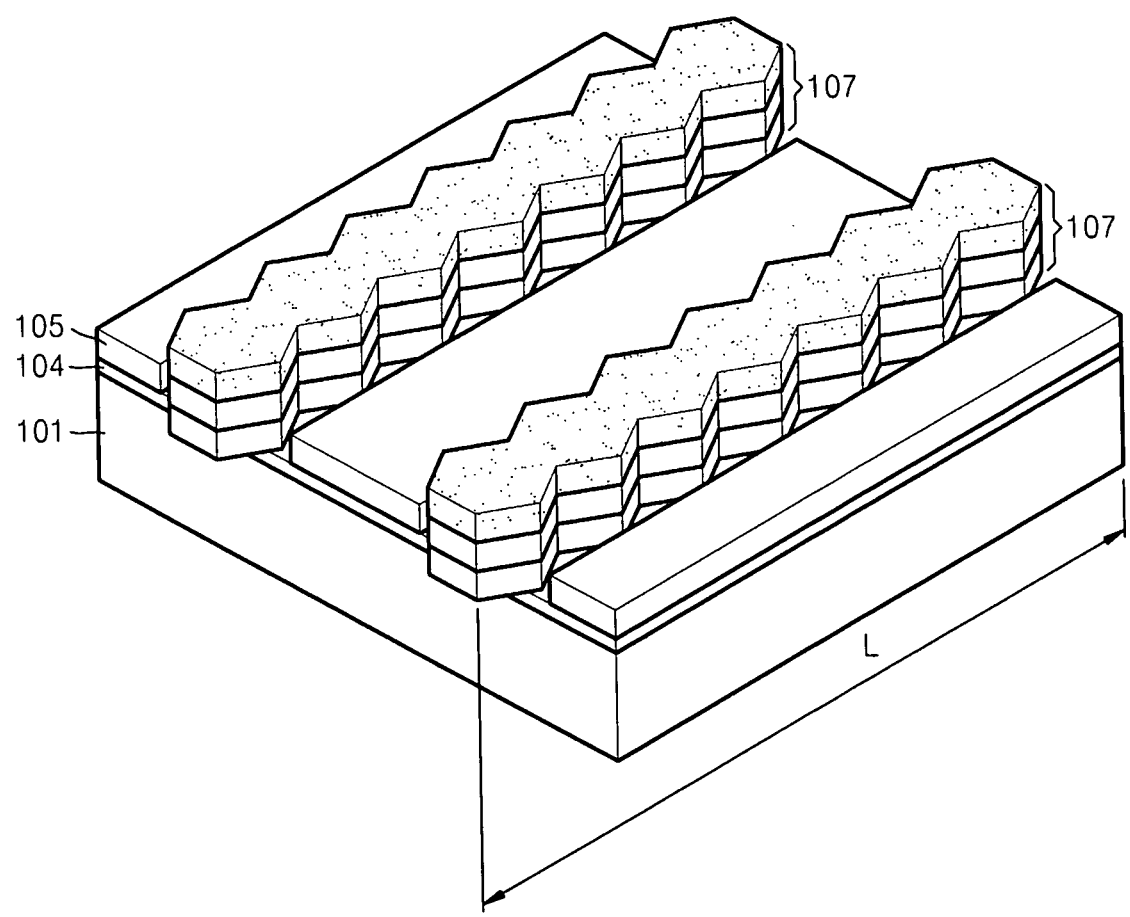

FIGS. 6A and 6B are perspective views schematically illustrating a method of forming the nano-dashes in the open regions of the template layer by using a nucleation site according to example embodiments.

The method of growing the nano-dashes 107 by using a metallic catalyst will be described.

Referring to FIG. 5A, if a metallic catalyst is used, a catalyst metallic layer 130 may be formed on the template layer 105. The catalyst metallic layer 130 may be formed of gold (Au), nickel (Ni), iron (Fe), nickel (Ni) nitrate or combinations thereof.

Referring to FIG. 5B, the catalyst metallic layer 130 is heated, and a plurality of metallic catalysts 131 may be formed in the open regions 120 of the template layer 105. A heating temperature may vary according to the material of the catalyst metallic layer 130. For example, a heating temperature of Au may be about 500° C. and a heating temperature of Ni nitrate may be about 950° C.

Figure 7A:
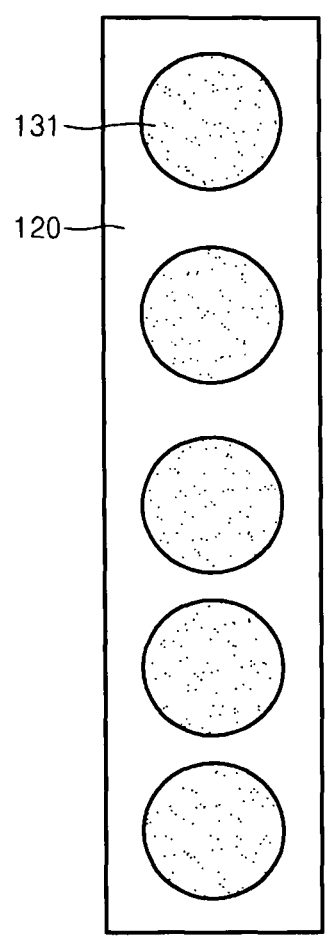
FIGS. 7A and 7B illustrate distribution of the metallic catalyst or the nucleation site formed in the open regions of the template layer according to example embodiments.
Figure 7B:
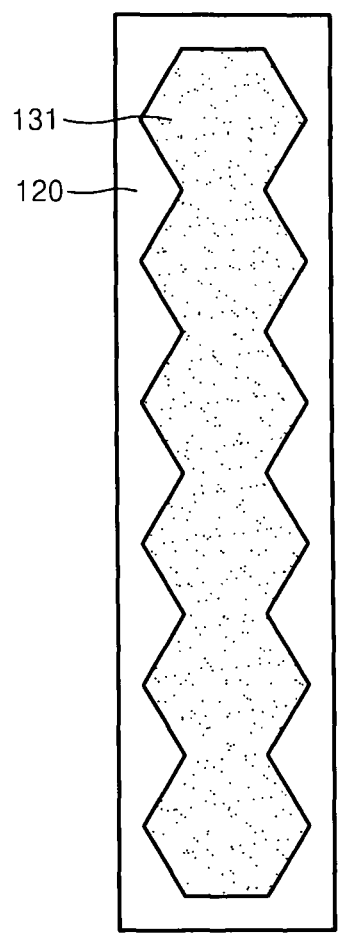

If the thickness of the catalyst metallic layer 130 is relatively small, the metallic catalysts 131 formed in the open regions 120 of the template layer 105 are in a shape of a plurality of nanodots that are separated from one another (as shown in FIG. 7A). If the thickness of the catalyst metallic layer 130 is relatively small, general nanorods are grown. If the thickness of the catalyst metallic layer 130 is substantially large, the metallic catalysts 131 formed in the open regions 120 of the template layer 105 have a shape whereby nanodots adhere and connect to one another in one direction (as shown in FIG. 7B). If the thickness of the catalyst metallic layer 130 is substantially large, the nano-dashes 107 according to example embodiments may be grown. The thickness of the catalyst metallic layer 130 may be about 20-nm to about 500-nm.

A process of depositing a material for forming the catalyst metallic layer 130 and a process of heating may be repeatedly performed in order to form the metallic catalysts 131 having a sufficient (or substantially large) thickness. In the above process, the metallic catalysts 131 may be formed on a surface of the template layer 105. The amount of the metallic catalysts 131 on the surface of the template layer 105 is relatively small, and a Group III-V-compound semiconductor material cannot be grown on a dielectric substance. As such, the location of the grown nano-dashes 107 may be confined to the open regions 120.

Figure 8:
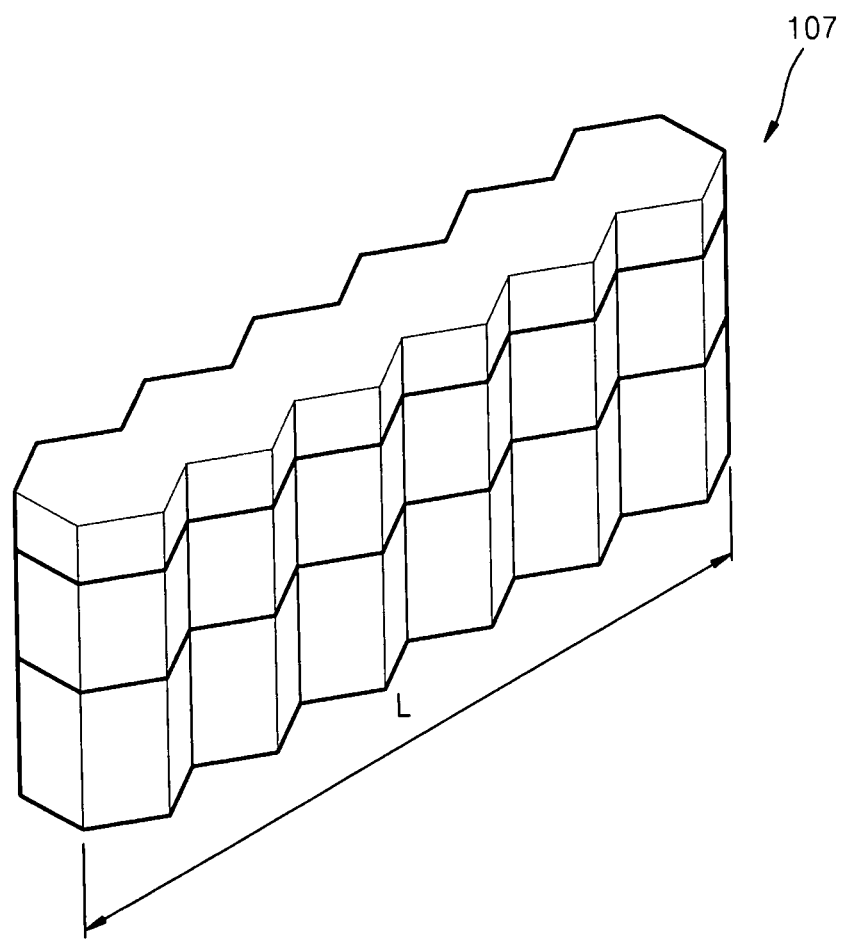
FIG. 8 is a schematic plan view illustrating a shape of the nano-dashes grown by performing the method illustrated in FIGS. 5A through 5C or the method illustrated in FIGS. 6A and 6B according to example embodiments.

Referring to FIG. 5C, after the metallic catalysts 131 having the sufficient (or desired) thickness are formed in the open regions 120 of the template layer 105, the nano-dashes 107 may be grown by performing a vapor-liquid-solid (VLS) growth method. The nano-dashes 107 are grown between the metallic catalysts 131 and the semiconductor layer 104. The grown nano-dashes 107 have a shape whereby a plurality of nanorods adhere and connect to one another in a straight line (L) along one surface of the semiconductor layer 104 (as shown in FIG. 8). Side surfaces of the nano-dashes 107 may be curved instead of flat. The nano-dashes 107 may have increased light extraction efficiency if the side surfaces of the nano-dashes 107 are curved opposed to if the side surfaces of the nano-dashes 107 are completely (or substantially) flat.

A contact area between the nano-dashes 107 shown in FIG. 8 and the lower and upper electrodes 103 and 110 is greater than if nanorods are used as the light-emitting source. As such, serial resistance is reduced, and light-emitting efficiency may be enhanced.

After the nano-dashes 107 are completely grown, the passivation layer 108 may be formed on side surfaces of the nano-dashes 107. The transparent insulating layer 109 and the upper electrode 110 may be formed, as described above. The metallic catalysts 131 that remain on the grown nano-dashes 107 may be removed. According to other example embodiments, the metallic catalysts 131 may remain on the grown nano-dashes 107. The metallic catalysts 131 are interposed between the nano-dashes 107 and the upper electrode 110. Due to the metallic catalysts 131, an ohmic contact between the nano-dashes 107 and the upper electrode 110 may be provided.

The method of growing the nano-dashes by using a nucleation site will now be described.

Referring to FIG. 6A, a plurality of nucleation sites 135 are formed in the open regions 120 of the template layer 105. Like the metallic catalysts 131, the nucleation sites 135 may have a structure in which they adhere and connect to one another in one direction. In order to form the nucleation sites 135, the time and flow rate at which the material used to form the nucleation sites 135 is provided to the template layer 105 may increase until the nucleation sites 135 are formed in the open regions 120 at the desired (or sufficient) density.

Referring to FIG. 6B, the nano-dashes 107 are grown using a process such as hydride vapor phase epitaxy (HVPE), molecular beam epitaxy (MBE), metal organic vapor phase epitaxy (MOVPE), metal organic chemical vapor deposition (MOCVD) halide chemical vapor deposition (HCVD) or similar process. If the nucleation site is used, the nano-dashes 107 are grown in the open regions 120 in which the semiconductor layer 104 is exposed. As described above, the passivation layer 108, the transparent insulating layer 109 and the upper electrode 110 are formed.

The nano-dashes 107 grown using the method described above may extend in one direction according to the shape of the open regions 120. Light emitted from the nano-dashes 107 has a dipole moment that is large and that is arranged along an extending direction of the nano-dashes 107 (i.e., along the direction labeled as "L" in FIG. 6B).

The light-emitting diode 100 according to example embodiments may emit polarized light. A length L of each of the open regions 120 should be sufficiently (or substantially) larger than a width W of each of the open regions 120 in order that the light-emitting diode 100 may emit polarized light. For example, if L/W is 5 or more and W=$\lambda$/2n (wherein $\lambda$ is a light-emitting wavelength and n is a refractive index of the nano-dashes 107), the light-emitting diode 100 may emit light having a high polarization ratio. The light-emitting diode 100 may be used in a backlight unit of a liquid crystal display (LCD) device, for example.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A light-emitting diode, comprising:
 a lower electrode on a substrate;
 a template layer on the lower electrode, the template layer having a plurality of open regions;
 a plurality of nano-dashes in the plurality of open regions of the template layer;
 a transparent insulating layer between the plurality of nano-dashes; and
 a transparent upper electrode on the plurality of nano-dashes and the transparent insulating layer,
 wherein one nano-dash is disposed in each of the open regions of the template layer, each of the nano-dashes has a plurality of nanowires, and side walls of the plurality of nanowires are connected to one another in a straight line.

2. The light-emitting diode of claim 1, wherein the lower electrode is a reflective electrode that reflects light emitted from the plurality of nano-dashes toward the upper electrode.

3. The light-emitting diode of claim 2, wherein the lower electrode includes at least one material selected from the group consisting of zirconium nitride (ZrN), hafnium nitride (HfN), titanium nitride (TiN), zirconium boride ($ZrB_2$) and combinations thereof.

4. The light-emitting diode of claim 1, further comprising:
 a buffer layer between the substrate and the lower electrode; and
 a semiconductor layer between the lower electrode and the template layer.

5. The light-emitting diode of claim 1, wherein the template layer has a thickness of about 100-nm to about 2-μm and includes at least one dielectric material selected from the group consisting of $SiO_2$, $SiN_x$, $Al_2O_3$, AlN, HfO and combinations thereof.

6. The light-emitting diode of claim 5, wherein each of the plurality of open regions of the template layer has a width (W) of about 50-nm to about 500-nm and a length (L) of about 50-nm to about 5-μm, and
 an interval between adjacent open regions of the plurality of open regions is about 5-nm to about 500-nm.

7. The light-emitting diode of claim 6, wherein the expressions $L/W \geq 5$ and $W = \lambda/2n$ are satisfied, $\lambda$ representing a light-emitting wavelength and n representing a refractive index of the plurality of nano-dashes.

8. The light-emitting diode of claim 1, wherein each of the plurality nano-dashes includes:
 a first region doped with a first conductivity-type dopant;
 a second region doped with a second conductivity-type dopant opposite in conductivity to the first conductivity-type dopant; and
 an active region between the first region and the second region.

9. The light-emitting diode of claim 8, wherein the plurality of nano-dashes include at least one material selected from the group consisting of (In)GaN, Zn(Mg)O, Zn(Cd)O, (Al)(In)GaAs, (Al)(In)GaAsP, (Al)(In)(Ga)NAs, InP, InAs and combinations thereof.

10. The light-emitting diode of claim 8, further comprising a passivation layer on side surfaces of each of the plurality of nano-dashes.

11. The light-emitting diode of claim 1, wherein the plurality of nano-dashes are grown in the plurality of open regions of the template layer using a metallic catalyst or nucleation site.

12. The light-emitting diode of claim 11, wherein the metallic catalyst includes at least one material selected from the group consisting of gold (Au), nickel (Ni), iron (Fe), nickel (Ni) nitrate and combinations thereof.

13. The light-emitting diode of claim 11, wherein the metallic catalyst provides an ohmic contact between the plurality of nano-dashes and the upper electrode, after growing the plurality of nano-dashes.

14. The light-emitting diode of claim 1, further comprising a distributed Bragg reflector (DBR) under the plurality of nano-dashes or on the entire top surface of the lower electrode.

15. The light-emitting diode of claim 10, wherein the passivation layer is formed of a dielectric material obtained by adjusting composition of (Al)(Ga)N.

16. The light-emitting diode of claim 10, wherein the passivation layer is formed on at least an active region of the nano-dashes.

* * * * *